United States Patent
Jang et al.

(10) Patent No.: US 10,797,192 B2
(45) Date of Patent: Oct. 6, 2020

(54) P-TYPE AMORPHOUS OXIDE SEMICONDUCTOR INCLUDING GALLIUM, METHOD OF MANUFACTURING SAME, AND SOLAR CELL INCLUDING SAME AND METHOD OF MANUFACTURING SAID SOLAR CELL

(71) Applicant: UNIVERSITY-INDUSTRY COOPERATION GROUP OF KYUNG HEE UNIVERSITY, Yongin-si, Gyeonggi-do (KR)

(72) Inventors: Jin Jang, Seoul (KR); Christophe Vincent Avis, Seoul (KR); Hyeong Pil Kim, Seoul (KR)

(73) Assignee: UNIVERSITY-INDUSTRY COOPERATION GROUP OF KYUNG HEE UNIVERSITY, Yongin-si, Gyeonggi-Do (KR)

( * ) Notice: Subject to any disclaimer, the term of this patent is extended or adjusted under 35 U.S.C. 154(b) by 120 days.

(21) Appl. No.: 15/127,174

(22) PCT Filed: Mar. 17, 2015

(86) PCT No.: PCT/KR2015/002587
§ 371 (c)(1),
(2) Date: Sep. 19, 2016

(87) PCT Pub. No.: WO2015/142038
PCT Pub. Date: Sep. 24, 2015

(65) Prior Publication Data
US 2017/0155009 A1 Jun. 1, 2017

(30) Foreign Application Priority Data
Mar. 17, 2014 (KR) .................. 10-2014-0031015
May 2, 2014 (KR) .................. 10-2014-0053558

(51) Int. Cl.
*H01L 31/072* (2012.01)
*H01L 51/42* (2006.01)
(Continued)

(52) U.S. Cl.
CPC ...... *H01L 31/072* (2013.01); *H01L 29/78693* (2013.01); *H01L 31/032* (2013.01);
(Continued)

(58) Field of Classification Search
CPC . H01L 31/072; H01L 29/78693; H01L 31/18; H01L 51/0036; H01L 51/0037;
(Continued)

(56) References Cited

U.S. PATENT DOCUMENTS 4,518,815 A * 5/1985 Yamazaki ........... H01L 27/1446
136/244
8,932,495 B1 * 1/2015 Nguyen ............. H01L 31/1884
136/252
(Continued)

FOREIGN PATENT DOCUMENTS

JP 2009-267002 A 11/2009
KR 10-2012-0009229 A 2/2012
(Continued)

OTHER PUBLICATIONS

D. Jousse, "Highly conductive and transparent amorphous tin oxide" J. Appl. Phys. 54 (1), Jan. 1983.*
(Continued)

*Primary Examiner* — Michael Y Sun
(74) *Attorney, Agent, or Firm* — Hauptman Ham, LLP

(57) ABSTRACT a p-type amorphous oxide semiconductor including gallium, a method of manufacturing the same, a solar cell including the same and a method of manufacturing the solar cell are disclosed. The p-type oxide semiconductor where gallium (Ga) is further combined with combination of one or more (Continued)

components selected from a group of CuS, SnO, ITO, IZTO, IGZO and IZO is provided.

2 Claims, 15 Drawing Sheets

(51) Int. Cl.
  *H01L 31/032* (2006.01)
  *H01L 29/786* (2006.01)
  *H01L 31/18* (2006.01)
  *H01L 51/00* (2006.01)
(52) U.S. Cl.
  CPC ............ *H01L 31/18* (2013.01); *H01L 51/422* (2013.01); *H01L 51/0036* (2013.01); *H01L 51/0037* (2013.01); *H01L 51/0047* (2013.01); *H01L 2224/05105* (2013.01); *H01L 2224/05147* (2013.01); *H01L 2224/05211* (2013.01); *H01L 2224/05247* (2013.01); *H01L 2924/10471* (2013.01); *H01L 2924/10524* (2013.01); *H01L 2924/10724* (2013.01); *Y02E 10/549* (2013.01); *Y02P 70/521* (2015.11)
(58) Field of Classification Search
  CPC . H01L 51/0047; H01L 51/422; H01L 31/032; H01L 2224/05211; H01L 2924/10524; H01L 2224/05105; H01L 2924/10471; H01L 2924/10724; H01L 2224/05147; H01L 2224/05247; Y02E 10/549; Y02P 70/521
  See application file for complete search history.

(56) References Cited

U.S. PATENT DOCUMENTS

| | | | |
|---|---|---|---|
| 2011/0056552 A1* | 3/2011 | Fujishima | H01L 31/022466 136/256 |
| 2011/0155209 A1* | 6/2011 | Tober | H01L 31/022425 136/244 |
| 2012/0192941 A1* | 8/2012 | Schoop | H01L 31/03923 136/256 |
| 2015/0123116 A1* | 5/2015 | Goto | C23C 14/08 257/43 |
| 2016/0020345 A1* | 1/2016 | Toyama | H01L 31/0326 136/265 |
| 2017/0263879 A1* | 9/2017 | Jang | C09K 11/06 |

FOREIGN PATENT DOCUMENTS

| | | |
|---|---|---|
| KR | 10-2012-0013731 A | 2/2012 |
| KR | 10-2012-0060351 A | 6/2012 |
| KR | 10-2012-0138012 A | 12/2012 |
| KR | 10-2013-0025077 A | 3/2013 |
| KR | 10-1284587 B1 | 7/2013 |
| KR | 10-2013-0089595 A | 8/2013 |
| KR | 10-2013-0140824 A | 12/2013 |
| WO | 2013/183726 A1 | 12/2013 |

OTHER PUBLICATIONS

Ji Hun Park "Structural and Electrical Characteristics of Gallium Tin Oxide Thin Films Prepared by Electron Cyclotron Resonance-Metal Organic Chemical Vapor Deposition" J. Nanosci. Nanotechnol. 2011, vol. 11, No. 8.*
Korean Office Action dated Feb. 9, 2015 corresponding to Korean Patent Application No. 10-2014-0053558.
Korean Office Action dated Jun. 29, 2015 corresponding to Korean Patent Application No. 10-2014-0031015.
Korean Notice of Allowance dated Sep. 25, 2015 corresponding to Korean Patent Application No. 10-2014-0053558.
Korean Notice of Allowance dated Jan. 20, 2016 corresponding to Korean Patent Application No. 10-2014-0031015.
International Search Report dated Jun. 30, 2015 corresponding to International Application No. PCT/KR2015/002587.

* cited by examiner

P-TYPE AMORPHOUS OXIDE SEMICONDUCTOR INCLUDING GALLIUM, METHOD OF MANUFACTURING SAME, AND SOLAR CELL INCLUDING SAME AND METHOD OF MANUFACTURING SAID SOLAR CELL

CROSS REFERENCE TO RELATED APPLICATION

This application claims the priority of Korean Patent Application No. 10-2014-0031015, filed on Mar. 17, 2014 and of Korean Patent Application No. 10-2014-0053558, filed on May 2, 2014 in the KIPO (Korean Intellectual Property Office). Further, this application is the National Phase application of International Application No. PCT/KR2015/002587 filed Mar. 17, 2015, which designates the United States and was published in Korean.

TECHNICAL FIELD

The present disclosure relates to a p-type amorphous oxide semiconductor including gallium, a method of manufacturing the same, a solar cell including the same and a method of manufacturing the solar cell.

BACKGROUND ART

An oxide semiconductor receives attention as material of an e-book, for replacing a variety of publications such as a newspaper, a magazine, a textbook, a book, etc., or a flexible display in recent. The oxide semiconductor has been actively studied.

This is because the oxide semiconductor can easily implement a transparent display due to high mobility and transparency, and overcome a limitation of the conventional techniques as well. The oxide semiconductor is regarded as alternative technique of the conventional techniques.

That is, in the conventional silicon Si based technique, a-Si based TFT device, which is a switching element for operating an organic light emitting diode OLED receiving attention as a next generation display, has low mobility. Additionally, the a-Si based TFT device may malfunction by a phenomenon that a threshold voltage varies by a bias stress. An extra compensation circuit is needed for improving the mentioned problems. As a result, it is difficult to overcome a limitation in view of aperture ratio and cost.

An excimer laser annealing ELA p-Si based TFT has higher mobility and low variation of the threshold voltage, compared with the a-Si based TFT device. However, a problem exists in that homogeneity of the ELA p-Si TFT is deteriorated when a polycrystalline structure is formed by a laser annealing.

The oxide semiconductor is a direct semiconductor having high mobility (1~100 [$cm^2$/Vs]) and bandgap. An oxidation phenomenon is not occurred to the oxide semiconductor unlike the silicon based device, and thus it has little characteristic variation.

Since the oxide semiconductor has an amorphous or polycrystalline structure at room temperature, a heat treatment process is not needed for forming an extra grain. A TFT device corresponding to the oxide semiconductor has excellent homogeneity.

An n-type oxide semiconductor has been mainly used as the oxide semiconductor by oxygen-vacancies and zinc interstitials. Since it is difficult to implement p-type doping, a CMOS type device is not implemented as yet. Many studies for controlling defect of the oxide semiconductor have been progressed so far.

Amorphous $InGaO_3(ZnO)_5$ (IGZO) based n-type channel material has been developed up to now (room temperature mobility: >10 $cm^2$/Vs), and it has been used as material of a TFT device. However, to form an active device such as a semiconductor (inverter, etc.), an optical device (LED, LD, etc.) or a solar cell on a flexible substrate, p-type amorphous oxide material having excellent electrical characteristics at low temperature has been required to be developed.

Additionally, for an optical device using an optical function, a thin film transistor using a new p-type transparent oxide semiconductor is needed to be developed, due to a limitation such as opaqueness by original small bandgap of the amorphous silicon and so on.

A hosono group in Japan issued a pn junction diode using amorphous ZnO—$Rh_2O_3$ (p-type) and IGZO (n-type) material in 2003.

Studies for developing new p-type semiconductor material using oxide have been progressed after issuing of the hosono group. A vacuum apparatus is mostly used in a procedure of manufacturing the oxide semiconductor. This manufacturing method can realize a low temperature procedure, but requires an expensive apparatus.

Accordingly, cost reduction may be achieved if an oxide semiconductor TFT is manufactured by using a solution process. That is, if an oxide semiconductor using the solution process is developed, solution can easily produced by using semiconductor precursors with various ratios, compared with in the vacuum process. Furthermore, the solution can be rapidly produced with low cost at low temperature, through a spin coating or an inkjet printing.

An oxide semiconductor known until now has mostly n-type feature. Thus, if a transparent oxide semiconductor having p-type feature is implemented, a CMOS type transparent electronic device can be manufactured. Moreover, the transparent oxide semiconductor having p-type feature is effective in view of driving of the OLED. Accordingly, studies for obtaining p-type transparent oxide semiconductor material for a transparent TFT device through adjustment of doping condition or development of new material, etc. are needed.

In the p-type oxide semiconductor developed at present, a polycrystalline oxide thin film transistor is issued, but an amorphous oxide thin film transistor is yet not issued. An amorphous transparent oxide semiconductor TOS can be manufactured through low temperature process. Additionally, a grain of the amorphous transparent oxide semiconductor TOS is very small, and thus surface roughness is very low. As a result, it is effective in epitaxy, and it is proper to fine patterning such as a lithography process and so on.

A solar cell is a device for converting directly light energy into electric energy. In initial of commercialization, a crystalline silicon solar cell having high conversion efficiency has been actively studied. However, the crystalline silicon solar cell is limited due to high manufacture cost, a weight and flexibility, and so an organic solar cell has been actively studied in recent.

The organic solar cell uses cheap organic matter and is manufactured in a large area through a solution process, and thus high productivity is expected. Furthermore, since thickness of the organic solar cell has several hundred nm at most, the organic solar cell may be manufactured with a flexible feature. Accordingly, the organic solar cell can be used as a new power for a microscopic device or a mobile communication device, etc., and thus it is expected that the organic solar cell is explosively used focused on a market wherein an inorganic solar cell cannot be recently used.

The organic solar cell has a metal-organic semiconductor (photoactive layer)-metal structure. In the organic solar cell, an indium tin oxide ITO, which is a transparent electrode, having high work-function is mainly used to an anode, and Al or Ag, etc. having low work-function is used as cathode material. The photoactive layer employs a D/A bilayer structure including an electron donor having thickness of approximately 100 nm and an electron acceptor, or a bulk-heterojunction ((D+A) blend)) structure. Or, the photoactive layer uses a combination structure (D/(D+A)/A) where the bulk-heterojunction structure is inserted between the electron donor and the electron acceptor.

One of factors for limiting photocurrent and efficiency of the organic solar cell is low charge mobility of the organic matter in bulk state. An organic semiconductor has many defects in view of molecular structure or crystallographical characteristics, and so charge mobility is considerably lower than that in an inorganic semiconductor. For example, semiconductor polymer C60 has low photocurrent even if it has very high electron-hole division efficiency. This is because the semiconductor polymer has lower electron mobility. Specifically, mobility of electron is generally lower than that of hole in the organic semiconductor. This low charge mobility badly affects also to an organic semiconductor device such as an organic light emitting device.

Accordingly, many studies for enhancing the mobility of electron have been progressed. A technique for enhancing the mobility of electron by controlling a surface shape when an organic thin film solar cell device is manufactured, or a technique for lowering an energy wall of interface of electrode and organic matter by forming a buffer layer between the electrode and an organic thin film so that electric charges are smoothly injected to each of the electrodes, etc. are developed.

Additionally, in an inverted organic solar cell, a buffer layer is formed between organic thin films, thereby enhancing mobility of electric charges and changing a moving direction of the electric charges.

The conventional technique about the inverted organic solar cell may be understood with reference to following Korean patent No. 10-1110810 (patent 1). Technique in the patent 1 is the conventional technique, and can be applied to the present specification.

The patent 1 is filed and registered by present applicant, and relates to the inverted organic solar cell capable of increasing more life expectancy and stability of the solar cell by inserting a $Cs_2CO_3$ layer and a $MoO_3$ layer between both electrodes and an active layer so that polarity of the electrodes are changed.

Transporting of hole is very important when an organic solar cell having high performance is manufactured. A poly(3,4-ethylenedioxythiophene) poly(styrenesulfonate) PEDOT:PSS layer is used as the conventional representative hole transporting layer, but it is limited in view of injection and transportation of the hole and stability of the solar cell.

An annealing time is needed when the PEDOT:PSS is used as the hole transporting layer, and thus a processing time gets longer.

On the other hand, a study for replacing the hole transporting layer with the oxide semiconductor is progressed.

As described above, the oxide semiconductor has high mobility and high bandgap. However, the n-type oxide semiconductor has been mainly used by the oxygen-vacancies and the zinc interstitials, and it is difficult to achieve the p-type doping.

SUMMARY

Accordingly, the invention is provided to substantially obviate one or more problems due to limitations and disadvantages of the related art. One embodiment of the invention provides a p-type oxide semiconductor including gallium, a method of manufacturing the same, a solar cell using the same and a method of manufacturing the solar cell. Specially, the p-type oxide semiconductor of the invention may be easily manufactured by a solution process, and thus it may be manufactured with low cost at low temperature. Additionally, an amorphous thin film may be formed at a concentration more than predetermined value according to concentration ratio of the gallium.

In one aspect, the invention provides a p-type oxide semiconductor where gallium (Ga) is further combined with combination of one or more components selected from a group of CuS, SnO, ITO, IZTO, IGZO and IZO.

The p-type oxide semiconductor has an amorphous structure.

The gallium Ga is in the range of 10 to 60 mole % based on the whole composition ratio.

The p-type oxide semiconductor of is expressed with one or more of following chemical formula 1, chemical formula 2 and chemical formula 3.

$CuS_{(1-x)}Ga_x$—SnO      [Chemical formula 1]

$CuSGa_xSn_{(1-x)}O$      [Chemical formula 2]

$CuSGa_xSnO$      [Chemical formula 3]

where, $0<x<1$.

In another aspect, the invention provides a method of manufacturing a p-type oxide semiconductor, the method comprising: producing precursor solution including Cu, S, M and Ga (here, M indicates a compound including one or more components selected from a group of SnO, ITO, IZTO, IGZO and IZO); coating the produced precursor solution on a substrate; and heat-treating a layer corresponding to the coating.

The precursor solution includes [$CuTu_3$]Cl.

The precursor solution includes Thiourea.

The gallium Ga is in the range of 10 to 60 mole % based on the whole composition ratio.

The coating is performed by an inkjet printing process.

In still another aspect, the invention provides an oxide thin film transistor comprising: a gate electrode; a gate insulator; an active layer; a source electrode; and a drain electrode. Here, the active layer is the p-type oxide semiconductor of claim 1 or claim 2.

The gate insulator is made up of oxide insulating material such as $SiO_2$, $Al_2O_3$ or their combination.

The gate electrode is made up of metal such as copper, aluminum or their combination.

The oxide thin film transistor further comprising: a protection layer formed on the active layer.

In still another embodiment, the invention provides an oxide semiconductor thin film which is deposited by a sputtering. Here, a sputter target used in the sputtering includes Cu, S, Ga and Sn.

In still another embodiment, the invention provides a solar cell including an anode, a hole transporting layer, a photoactive layer, an electron transporting layer and a cathode. Here, the hole transporting layer is a p-type oxide semiconductor where gallium Ga is further combined with combination of one or more components selected from a group of CuS, SnO, ITO, IZTO, IGZO and IZO.

In still another embodiment, the invention provides a method of manufacturing a solar cell, the method comprising: forming an anode on a substrate by using a vacuum deposition process; forming a hole transporting layer on the anode by using a solution process; forming a photoactive layer on the hole transporting layer by using a solution process; forming an electron transporting layer on the photoactive layer by using a solution process; and forming a cathode on the electron transporting layer. Here, the hole transporting layer is formed by coating corresponding layer with solution where a p-type oxide semiconductor containing gallium Ga is mixed with solvent.

In one embodiment of the invention, a p-type oxide semiconductor containing gallium is used as a hole transporting layer, so that a solar cell having high performance may be implemented.

Furthermore, since the p-type oxide semiconductor is manufactured by using a solution process, it may be manufactured with low cost at low temperature.

Moreover, the p-type oxide semiconductor containing gallium is used as the hole transporting layer, so that a solar cell having high performance may be implemented.

BRIEF DESCRIPTION OF DRAWINGS

Example embodiments of the present invention will become more apparent by describing in detail example embodiments of the present invention with reference to the accompanying drawings, in which.

Figure 3:
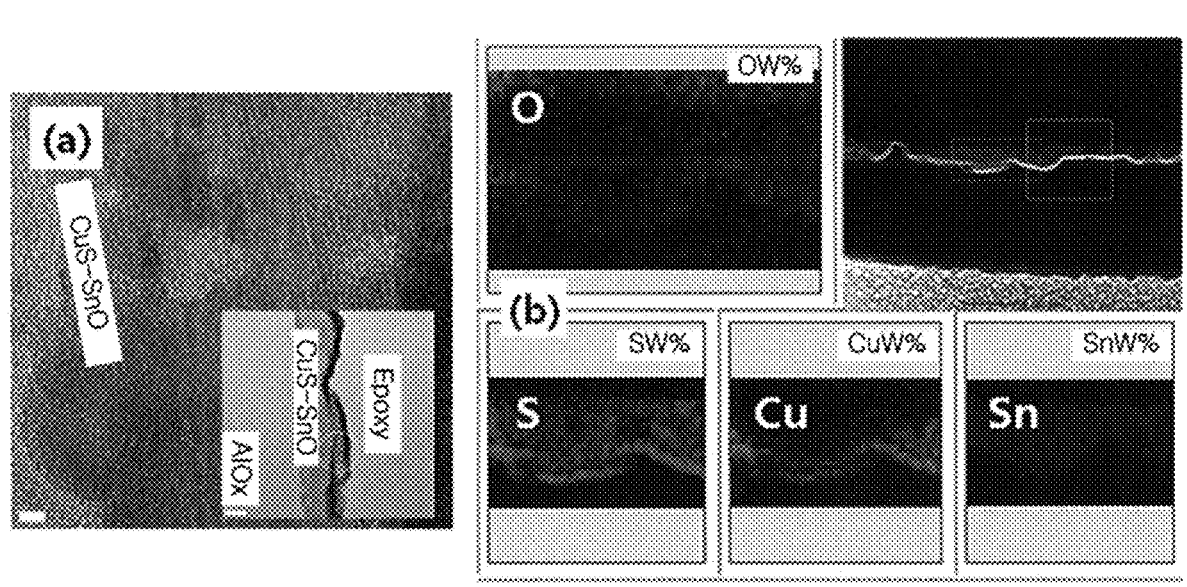
Figure 4:
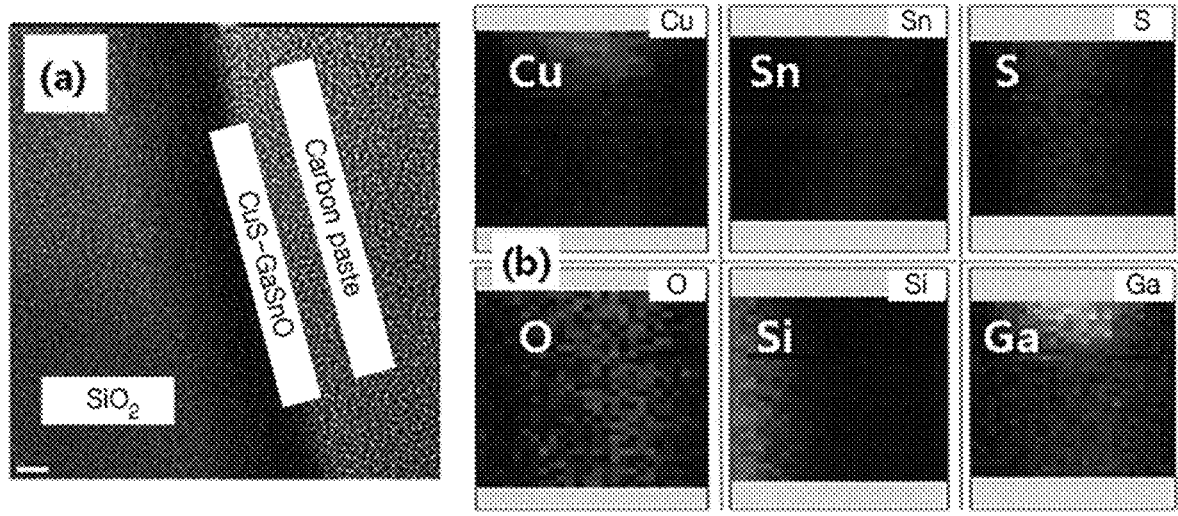
Figure 5:
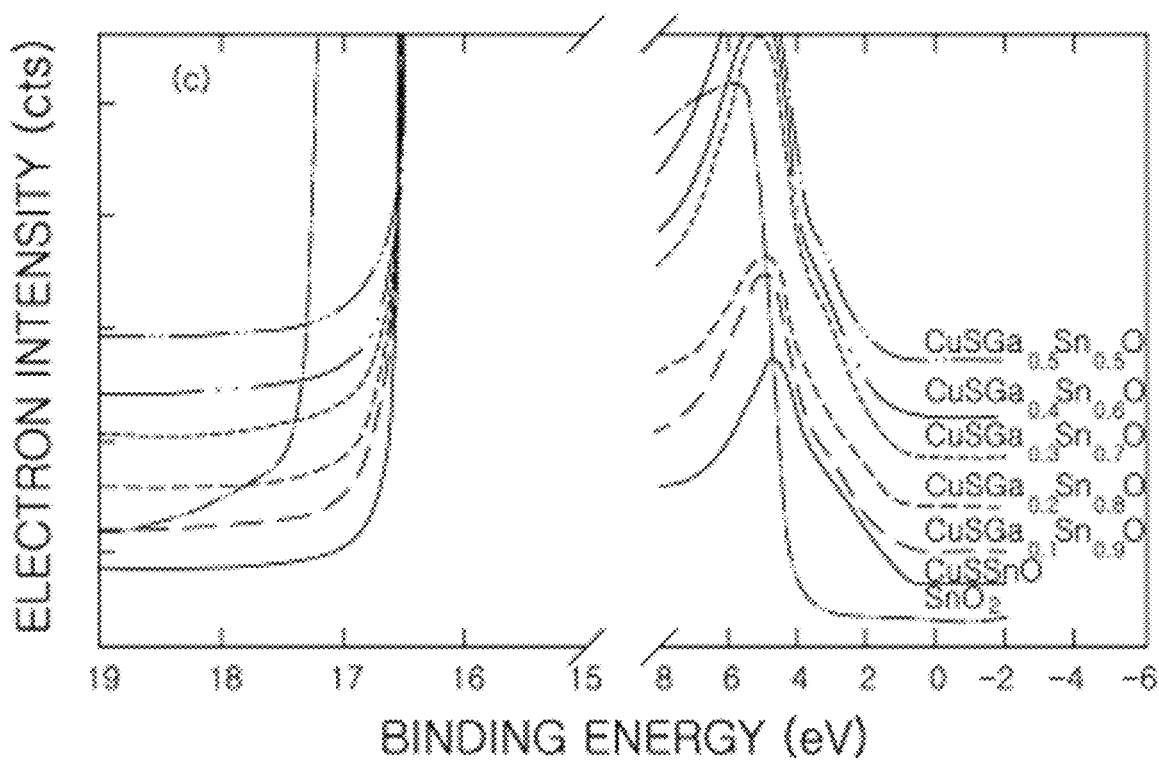
Figure 6:
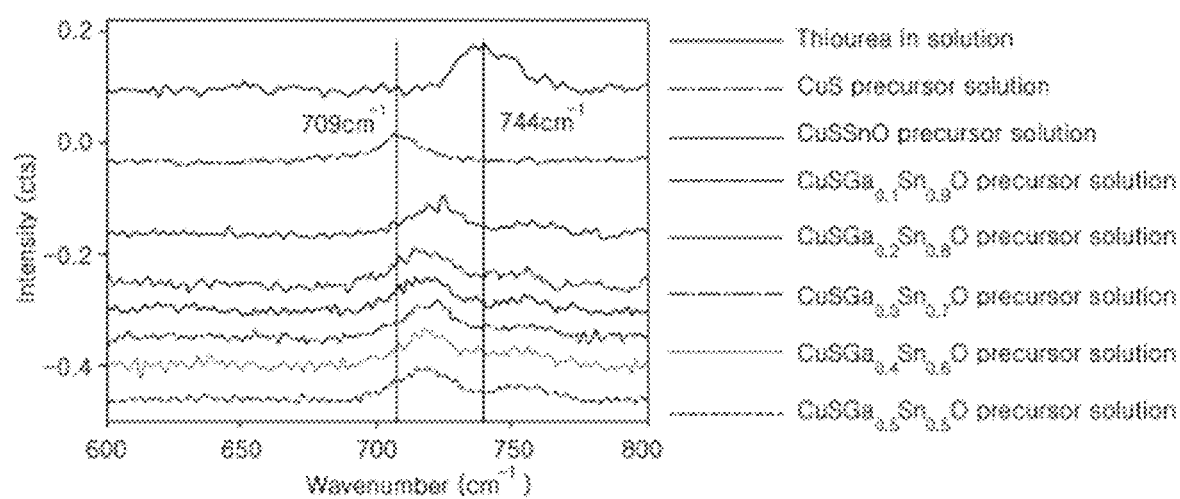
Figure 7:
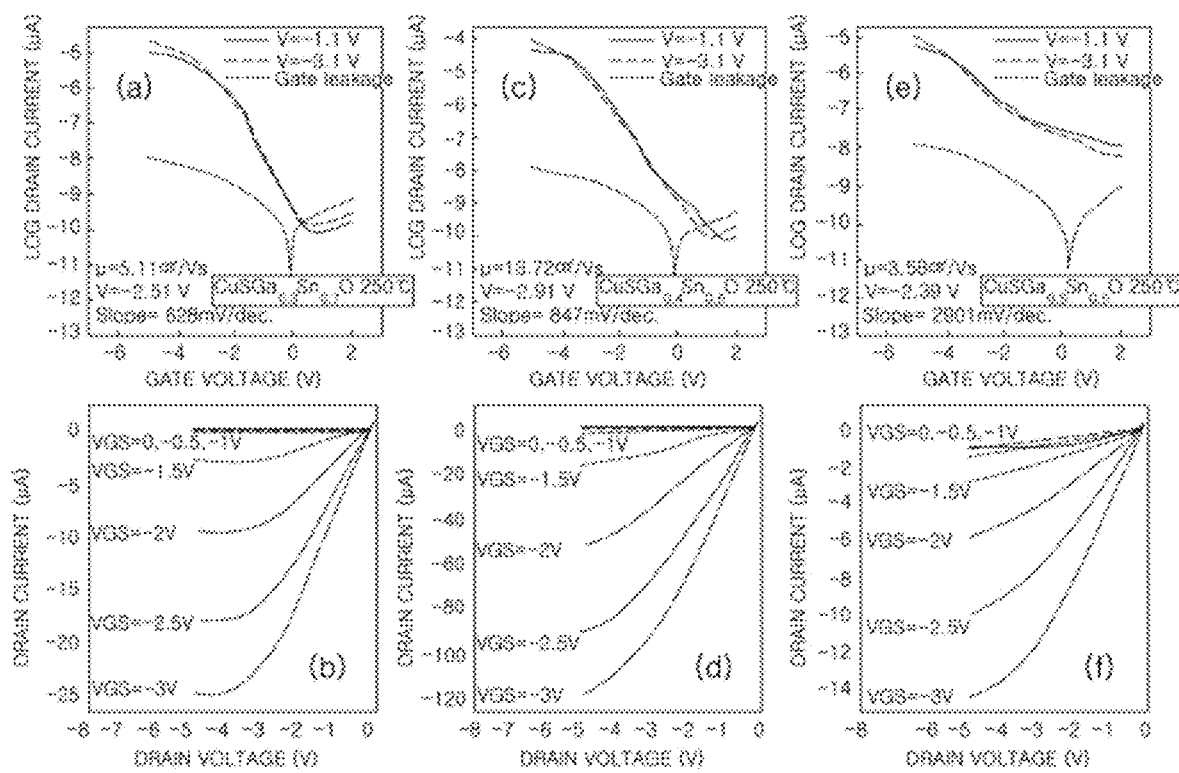
Figure 8:
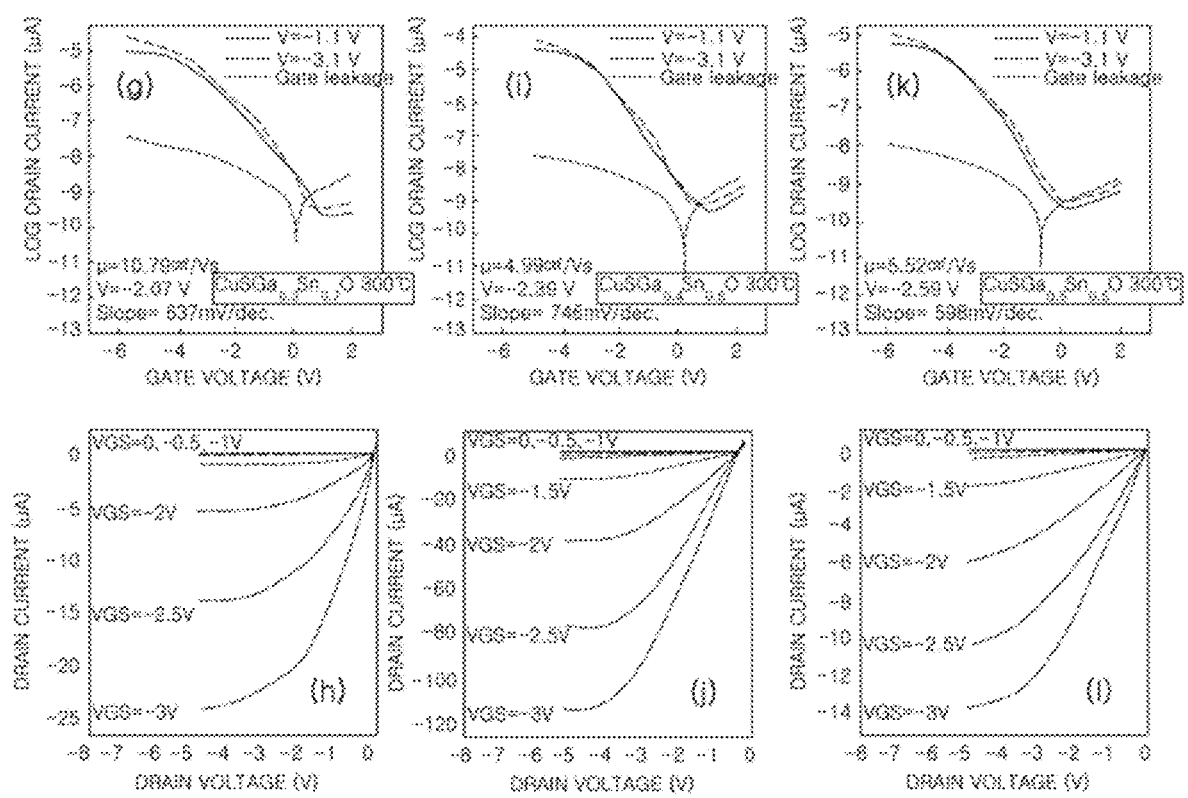
Figure 9:
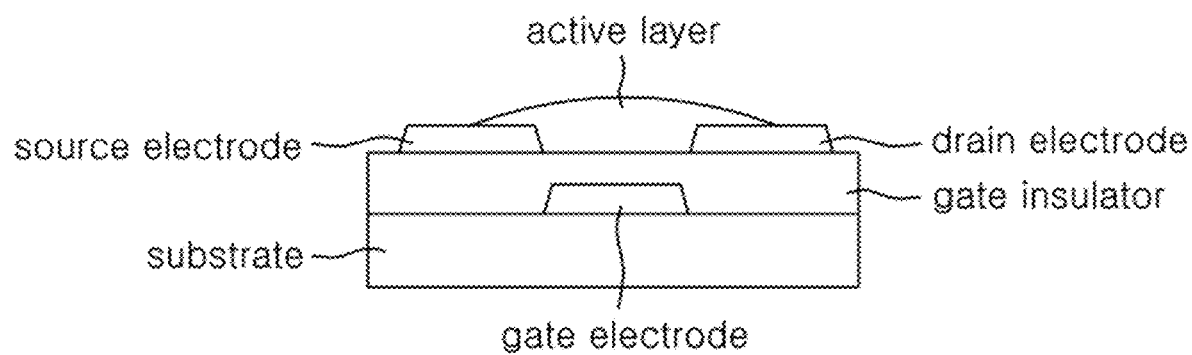
Figure 10:
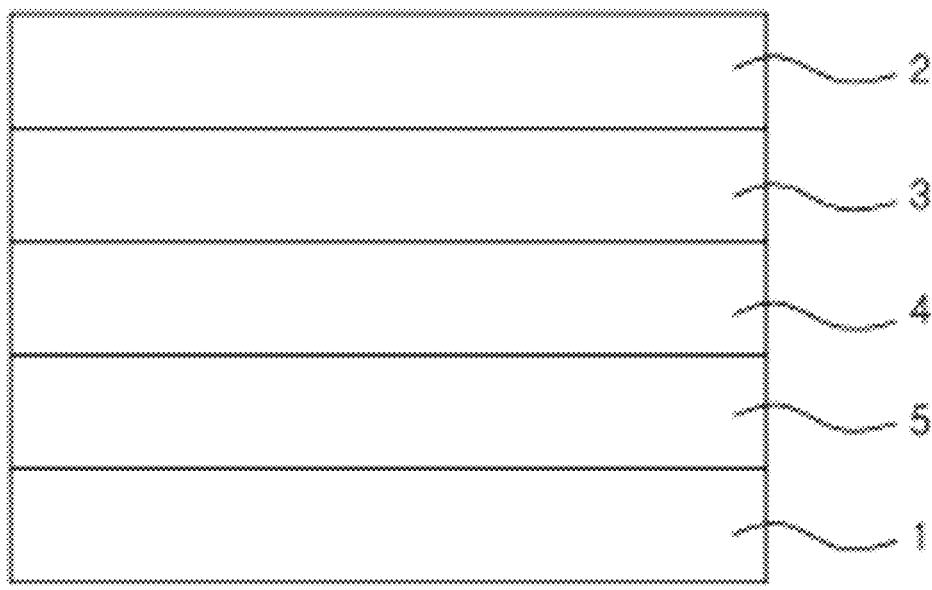
Figure 11:
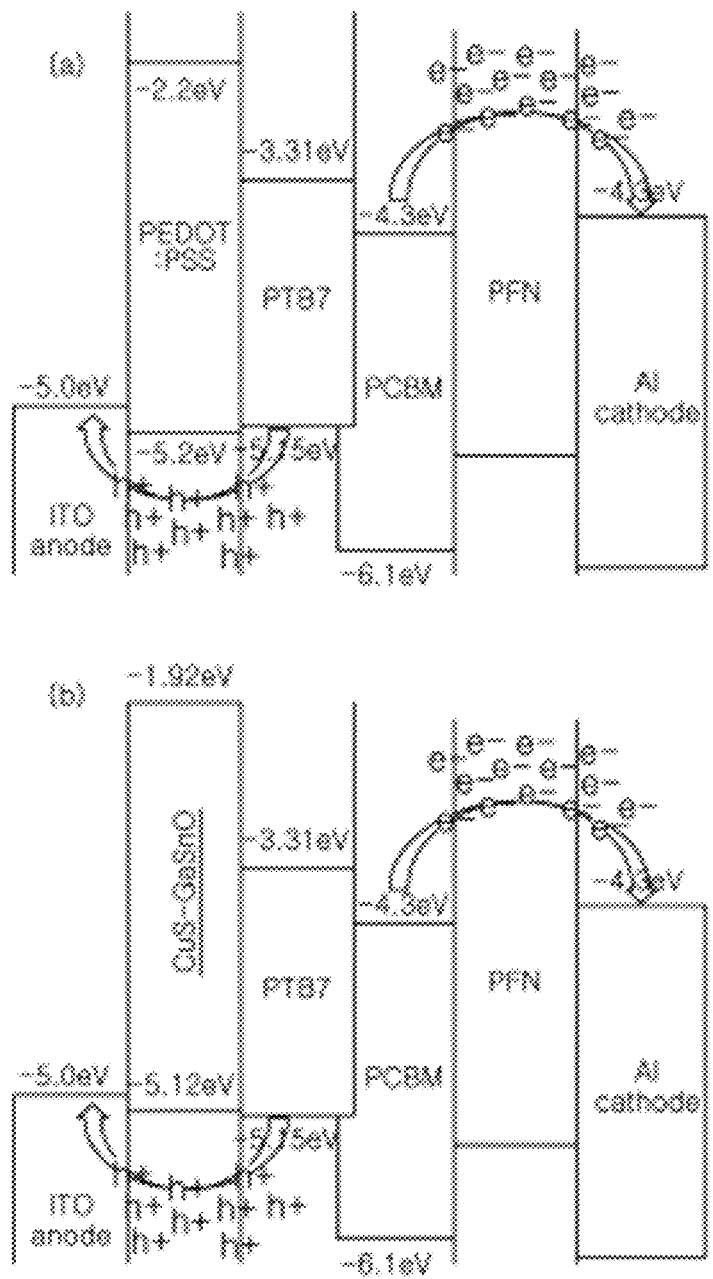
Figure 12:
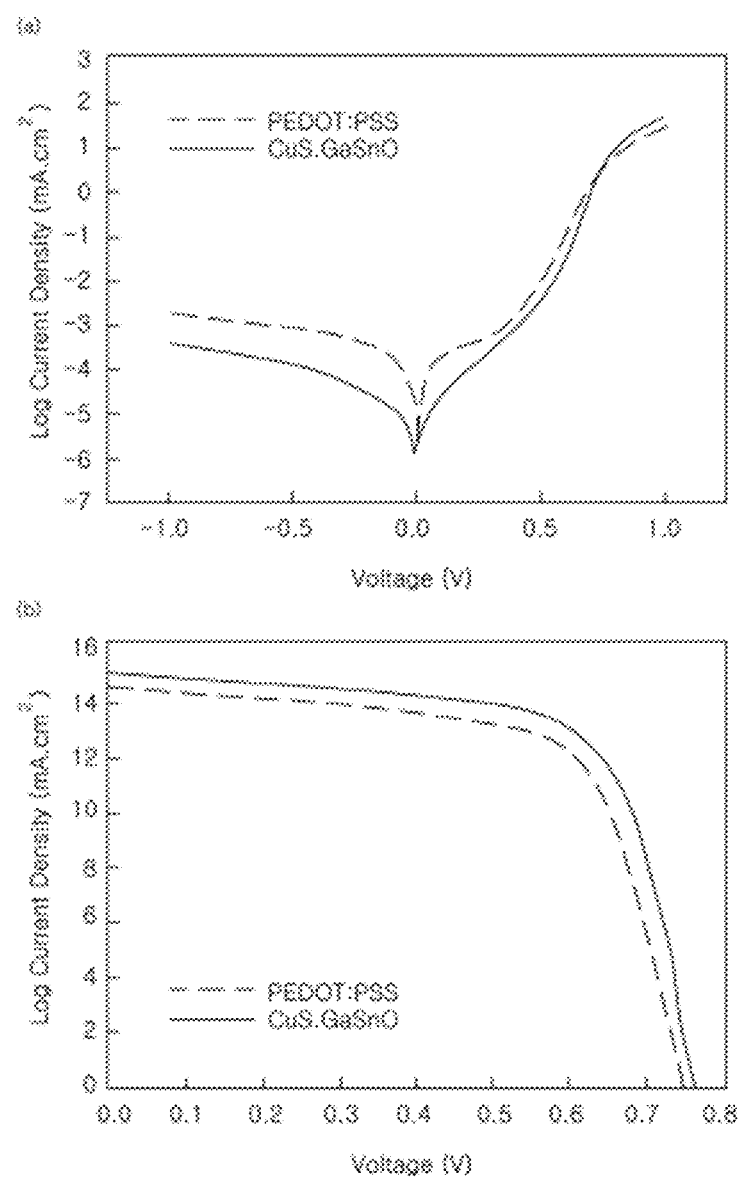
Figure 13:
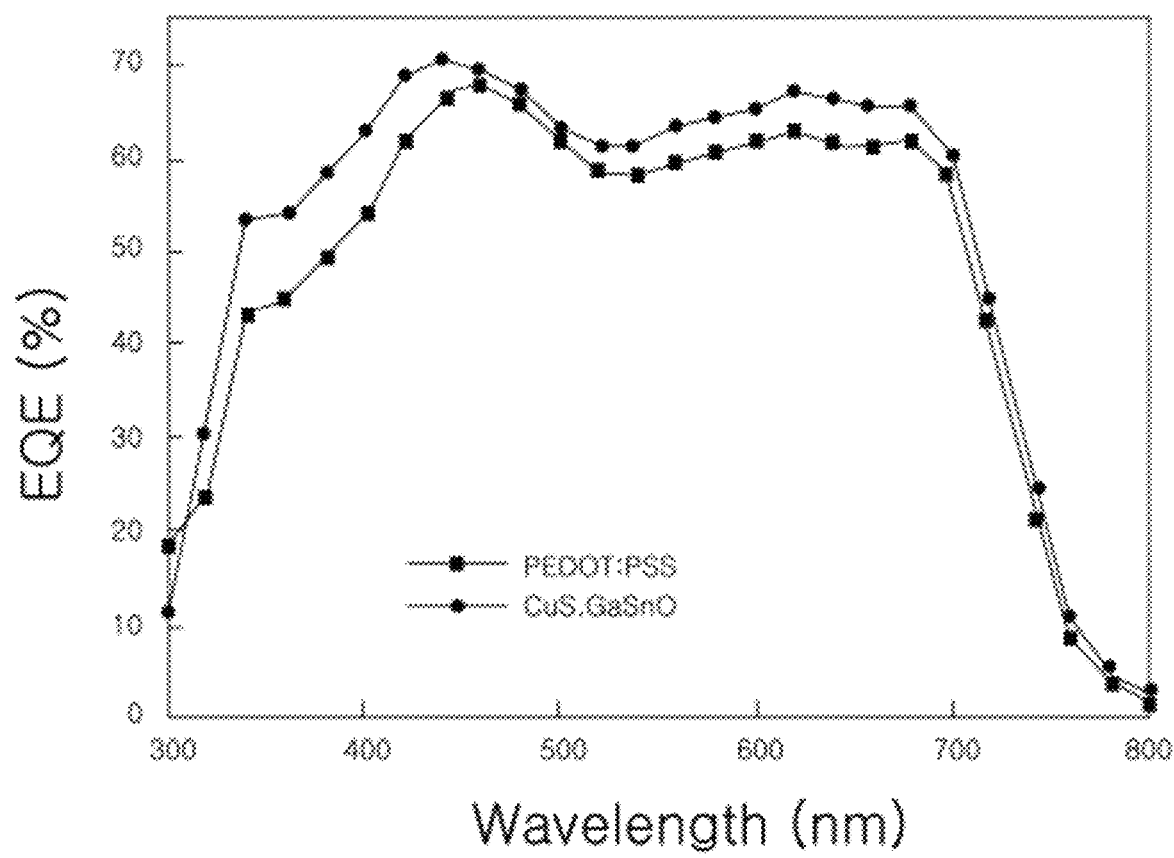
Figure 14:
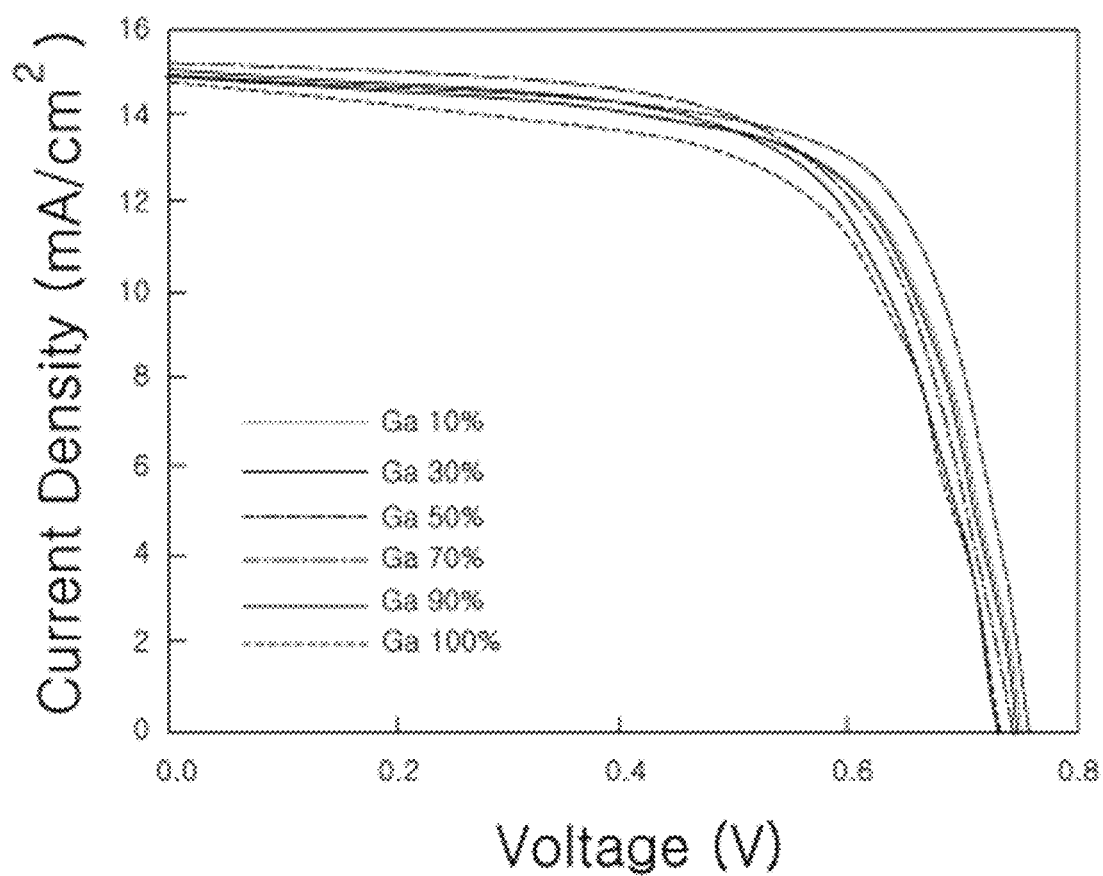
Figure 15:
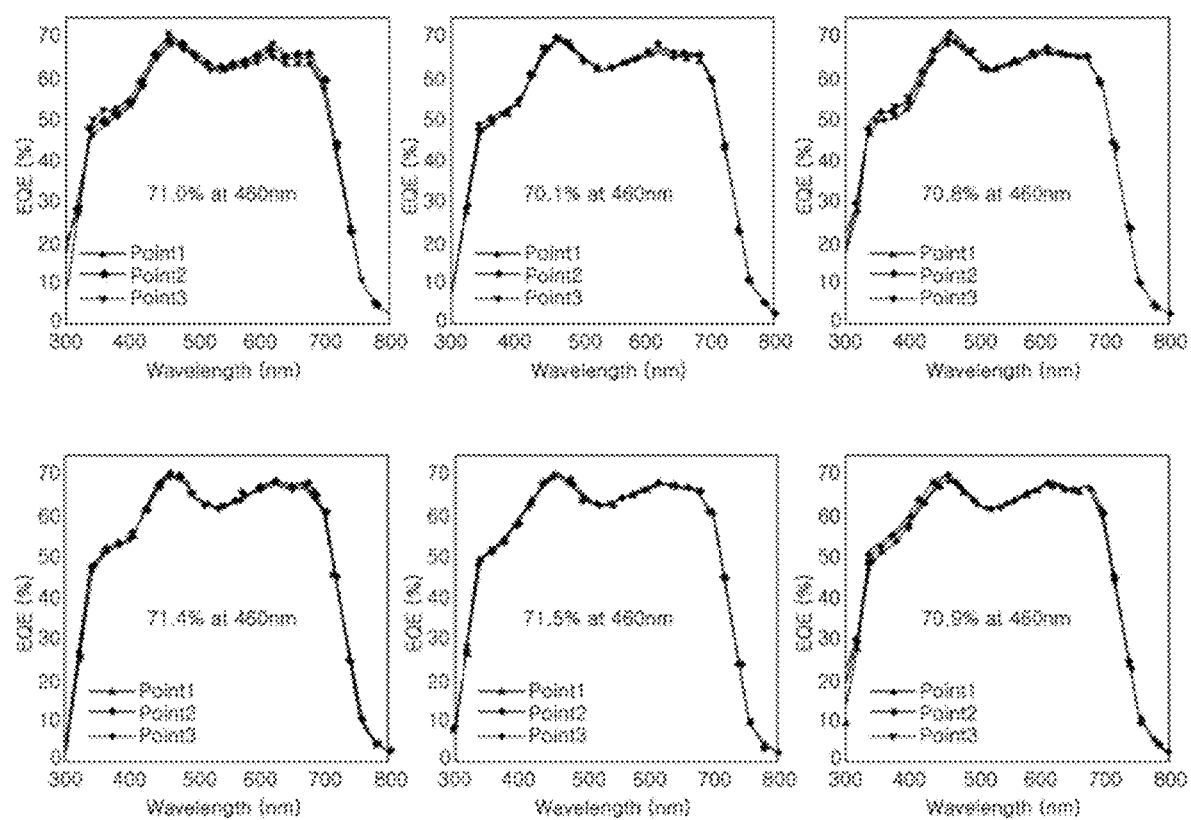

(a) in FIG. 3 shows TEM image of a CuS—SnO thin film, and (b) in FIG. 3 illustrates an atomic mapping image of the CuS—SnO thin film according to an EDX (Energy Dispersive X-ray) spectroscopy;

(a) in FIG. 4 shows TEM image of a $CuS\text{—}Ga_{0.5}Sn_{0.5}O$ thin film, and (b) in FIG. 4 illustrates an atomic mapping image of the $CuS\text{—}Ga_{0.5}Sn_{0.5}O$ thin film according to an EDX (Energy Dispersive X-ray) spectroscopy;

FIG. 5 shows UPS (Ultraviolet Photo Spectroscopy) spectrum and work function of $SnO_2$ and $CuS\text{—}Ga_xSn_{(1-x)}O$;

FIG. 6 is a view illustrating Raman spectrum result of the p-type precursor solution;

FIG. 7 is a view illustrating output characteristics of $CuSGa_{0.3}Sn_{0.7}O$, $CuSGa_{0.4}Sn_{0.6}O$ and $CuSGa_{0.5}Sn_{0.5}O$ thin film transistors which are used as the active layer formed by the inkjet printing at temperature of 250° C.;

FIG. 8 is a view illustrating output characteristics of $CuSGa_{0.3}Sn_{0.7}O$, $CuSGa_{0.4}Sn_{0.6}O$ and $CuSGa_{0.5}Sn_{0.5}O$ thin film transistors which are used as the active layer formed by the inkjet printing at temperature of 300° C.;

FIG. 9 is a sectional view illustrating a thin film transistor according to one embodiment of the invention;

FIG. 10 is a sectional view illustrating an organic solar cell according to one embodiment of the invention;

FIG. 11 is a view illustrating an energy band diagram when the p-type oxide semiconductor containing gallium is used and an energy band diagram when PDDOT:PSS is used;

FIG. 12 illustrates an energy band diagram of the p-type oxide semiconductor containing gallium;

FIG. 13 shows an external quantum efficiency EQE of the solar cell when the p-type oxide semiconductor containing the gallium is used and an EQE of the solar cell when the PEDOT:PSS is used;

FIG. 14 illustrates current-voltage characteristics of the solar cell when the hole transporting layer is formed by using p-type oxide semiconductors containing different concentration of gallium according to one embodiment of the invention; and FIG. 15 shows EQE of the solar cell according to concentration of the gallium.

DETAILED DESCRIPTION

Hereinafter, embodiment of the invention will be described in detail.

In one aspect, the invention relates to a p-type oxide semiconductor where gallium Ga is further combined with combination of one or more components selected from a group of CuS, SnO, ITO, IZTO, IGZO and IZO.

CuS means copper monosulfide, SnO indicates Tin(II) oxide, ITO means indium tin oxide, IZTO indicates indium zinc tin oxide, IGZO means indium zinc gallium oxide, and IZO indicates indium zinc tin oxide. It will be immediately obvious to those skilled in the art that these components are well-known.

In a feature of the invention, crystalline thin film is changed to amorphous thin film if concentration of gallium Ga is adjusted to a value more than 0.3 in $CuS\text{—}Ga_xSn_{(1-x)}O$. This will be described in detail with reference to accompanying embodiments.

It is desirable that the gallium Ga is in the range of 10 to 60 mole % based on the whole composition ratio.

The p-type oxide semiconductor of the present embodiment may be expressed with one or more chemical formulas selected from following chemical formula 1, chemical formula 2 and chemical formula 3.

$CuS_{(1-x)}Ga_x\text{—}O$            [Chemical formula 1]

$CuSGa_xSn_{(1-x)}O$            [Chemical formula 2]

$CuSGa_xSnO$            [Chemical formula 3]

In the chemical formula 1, the chemical formula 2 or the chemical formula 3, $0<x<1$.

In another aspect, the invention provides a method of manufacturing the p-type oxide semiconductor comprising sequentially:

producing precursor solution including Cu, S, M and Ga (here, M indicates a compound including one or more components selected from a group of SnO, ITO, IZTO, IGZO and IZO);

coating the precursor solution on a substrate; and heat-treating a layer corresponding to the coating.

It is desirable that the precursor solution contains [CuTu₃]Cl.

It is desirable that the precursor solution includes Thiourea.

The gallium Ga is preferably in the range of 10 to 60 mole % based on the whole composition ratio.

The coating may be performed by a vacuum process, a spin coating, a slot printing or an inkjet printing process. However, it is desirable that the coating is performed by the spin coating or the inkjet printing process in view of simplicity of the process and cost.

In another embodiment of the invention, an oxide thin film transistor includes:

a gate electrode, a gate insulator, an active layer, a source electrode and a drain electrode, wherein the active layer corresponds to the p-type oxide semiconductor of the invention.

FIG. 9 is a sectional view illustrating a thin film transistor according to one embodiment of the invention.

The gate insulator may contain oxide insulating material such as $SiO_2$, $Al_2O_3$ or their combination, but is not limited.

The gate electrode may use metal such as copper, aluminum or their combination, but is not limited.

A protection layer may be formed on the active layer to prevent damage from outside.

The other elements in the thin film transistor may use elements in the conventional technique as long as the elements in the conventional technique do not obviate the object of the invention. The detailed description concerning the elements will be omitted.

Hereinafter, the embodiments of the invention will be described in detail. The following embodiments are used for detailed description of the invention, but it does not limit scope of the invention.

Embodiment

Production of Precursor Solution

Under nitrogen environment, the precursor solution is produced by dissolving $CuCl_2$, $NH_2CSNH_2$ (Thiourea), $Ga(NO_3)_3 \cdot xH_2O$ (Gallium nitrate hydrate) and $SnCl_2$ in acetonitrile and ethylene glycol solvent.

Forming of the Active Layer

The active layer is formed by spin coating the produced precursor solution, and then heat-treating a layer corresponding the coating on a hot plate of 240° C. for approximately 1 minute or inkjet printing on a substrate of 60° C.

Heat-Treating

The active layer formed by the spin coating or the inkjet printing is annealed under nitrogen atmosphere, for approximately 1 hour at temperature of 300° C.

Analysis of the Oxide Semiconductor

Figure 1:
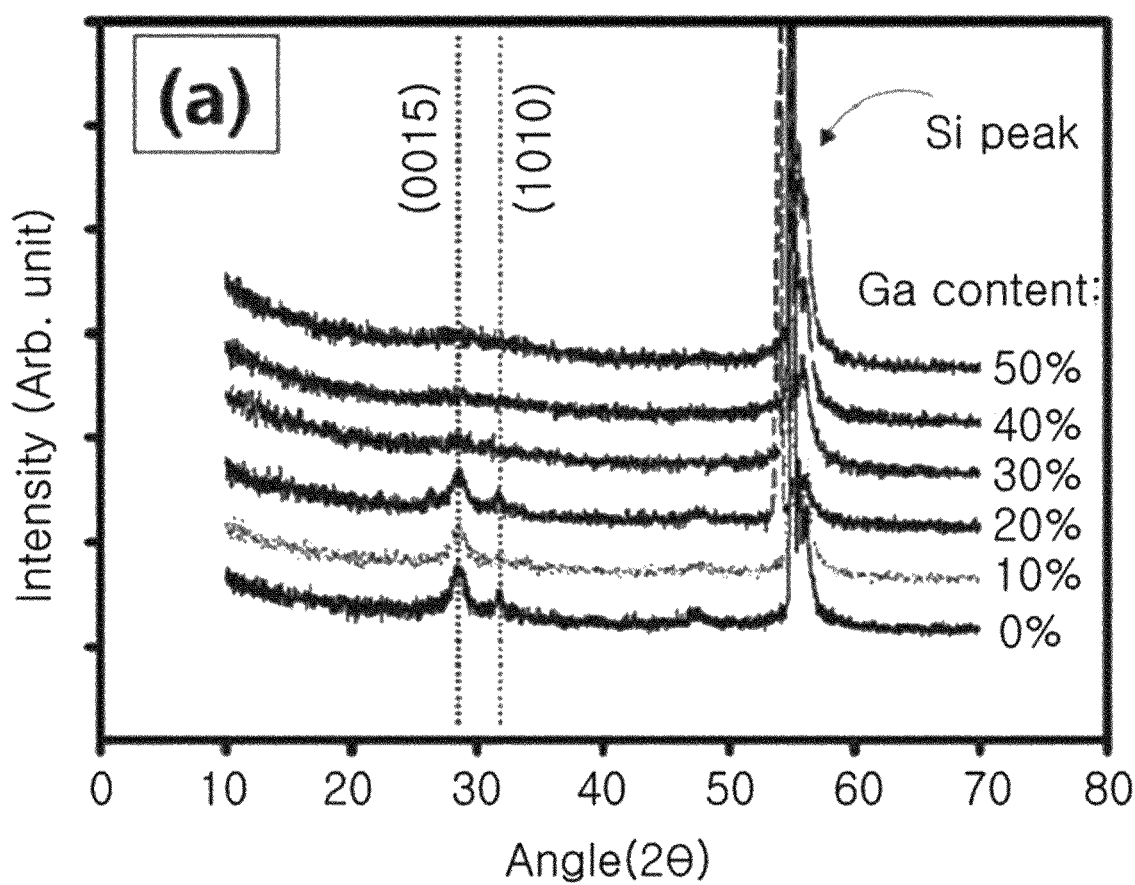
FIG. 1 is a view illustrating a XRD result when concentration of gallium Ga is in the range of 0 to 50% in a $CuS\text{—}Ga_xSn_{(1-x)}O$ thin film.

FIG. 1 is a view illustrating a XRD result when concentration of gallium Ga is in the range of 0 to 50% in a $CuS$—$Ga_xSn_{(1-x)}O$ thin film.

$CuS$—$Ga_xSn_{(1-x)}O$ has a polycrystalline structure (2θ=28°,32°), and is changed from crystalline state to amorphous state in the event that the concentration of the gallium Ga is more than 30%.

Figure 2:
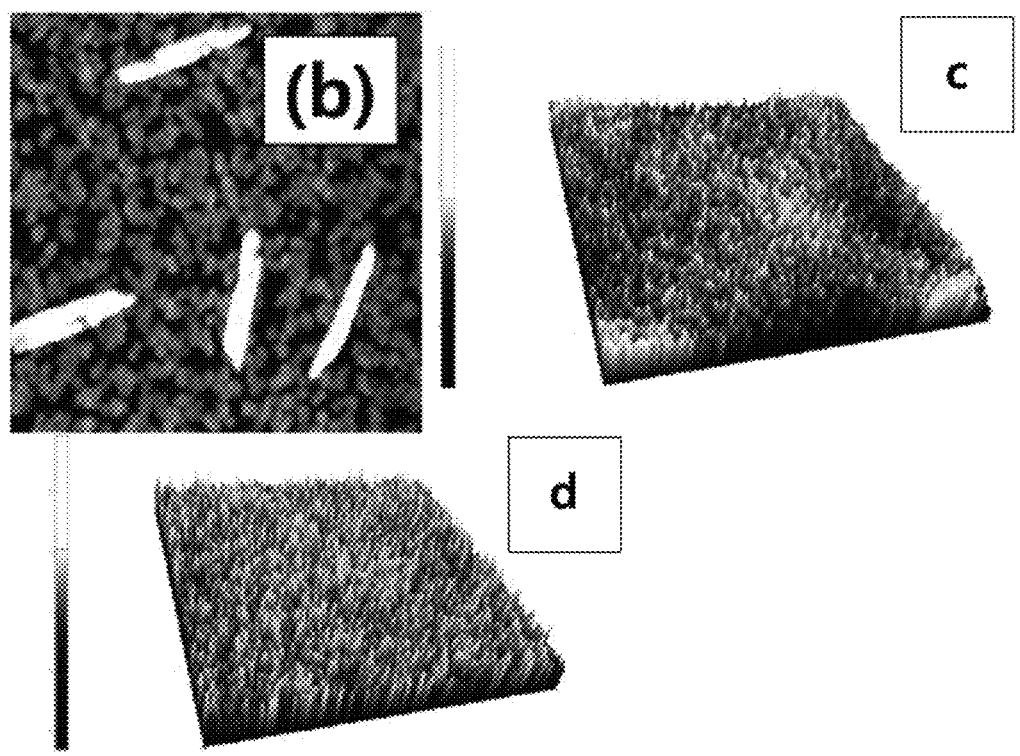
FIG. 2 is a view illustrating an AFM image when the concentration of the gallium Ga is 0%, 30% and 50% in the $CuS\text{—}Ga_xSn_{(1-x)}O$ thin film.

FIG. 2 is a view illustrating an AFM image when the concentration of the gallium Ga is 0%, 30% and 50% in the $CuS$—$Ga_xSn_{(1-x)}O$ thin film.

A thin film having needle shape is formed when the concentration of the gallium Ga is 0%. A value of root-mean-square (RMS) roughness of the thin film equals to 23~90 nm. In this case, quality of the thin film is not good.

However, the more the concentration of the gallium Ga increases, the more the value of root-mean-square (RMS) roughness reduces. As a result, the quality of the thin film is enhanced. The value of root-mean-square (RMS) roughness of the thin film equals to 0.46~2.5 nm when the concentration of the gallium Ga is 30%, and it equals to 0.67~3.4 nm when the concentration of the gallium Ga is 50%.

(a) in FIG. 3 shows TEM image of a CuS—SnO thin film, and (b) in FIG. 3 illustrates an atomic mapping image of the CuS—SnO thin film according to an EDX (Energy Dispersive X-ray) spectroscopy. The CuS—SnO thin film contains Cu, S, Sn and O, and has a non-uniform crystalline structure.

This corresponds to the fact that crystalline peak exists when the gallium Ga is 0% in an XRD result in FIG. 1.

(a) in FIG. 4 shows TEM image of a $CuS$—$Ga_{0.5}Sn_{0.5}O$ thin film, and (b) in FIG. 4 illustrates an atomic mapping image of the CuS—Ga $Sn_{0.5}O$ thin film according to an EDX (Energy Dispersive X-ray) spectroscopy. The CuS—Ga $Sn_{0.5}O$ thin film contains Cu, S, Sn and O, and it has uniform amorphous structure.

FIG. 5 and Table 1 show UPS (Ultraviolet Photo Spectroscopy) spectrum and work function of $SnO_2$ and $CuS$—$Ga_xSn_{(1-x)}O$, difference of Fermi level and valence band, and a value of ionization potential.

TABLE 1

| Material | Work function (eV) | $E_F$-$E_{VBM}$ (eV) | Ip(eV) |
|---|---|---|---|
| $SnO_2$ | 3.96 | 3.56 | 7.52 |
| CuS—SnO | 4.64 | 0.73 | 5.37 |
| CuS—$Ga_{0.1}Sn_{0.9}O$ | 4.63 | 0.94 | 5.57 |
| CuS—$Ga_{0.2}Sn_{0.8}O$ | 4.61 | 0.93 | 5.54 |
| CuS—$Ga_{0.3}Sn_{0.7}O$ | 4.66 | 0.93 | 5.59 |
| CuS—$Ga_{0.4}Sn_{0.6}O$ | 4.7 | 0.99 | 5.69 |
| CuS—$Ga_{0.5}Sn_{0.5}O$ | 4.7 | 1.02 | 5.72 |

In case of crystalline thin film (Ga<0.3) of $CuS$—$Ga_xSn_{(1-x)}O$, the work function is 4.63 eV and 4.61 eV. In case of amorphous thin film (Ga≥0.3) of $CuS$—$Ga_xSn_{(1-x)}O$, the work function has a high value more than 4.66 eV.

FIG. 6 is a view illustrating Raman spectrum result of the p-type precursor solution. FIG. 6 shows Raman spectrum result of the p-type precursor solution in a region of 600-800 $cm^{-1}$. $[CuTu_3]n$ polymer is formed at 710 $cm^{-1}$. If Ga or Sn is added, wave number is shifted to 720 $cm^{-1}$. This means that Ga or Sn exists in the solution.

FIG. 7 is a view illustrating output characteristics of $CuSGa_{0.3}Sn_{0.7}O$, $CuSGa_{0.4}Sn_{0.6}O$ and $CuSGa_{0.5}Sn_{0.5}O$ thin film transistors which are used as the active layer formed by the inkjet printing at temperature of 250° C.

FIG. 8 is a view illustrating output characteristics of $CuSGa_{0.3}Sn_{0.7}O$, $CuSGa_{0.4}Sn_{0.6}O$ and $CuSGa_{0.5}Sn_{0.5}O$ thin film transistors which are used as the active layer formed by the inkjet printing at temperature of 300° C.

As shown in FIG. 8, in the event that the $CuSGa_{0.5}Sn_{0.5}O$ thin film transistor is used as the active layer, high field effect mobility of 28.52 $cm^2$/Vs and a threshold voltage of −3.96V are formed.

Hereinafter, a solar cell including the oxide semiconductor will be described in detail with reference to accompanying drawings.

FIG. 10 is a sectional view illustrating an organic solar cell according to one embodiment of the invention.

In FIG. 10, the organic solar cell of the present embodiment includes an anode 1, a cathode 2, an electron transporting layer 3, a photoactive layer 4 and a hole transporting layer 5.

As shown in FIG. 10, the organic solar cell of the invention has an inverted structure where the cathode 2 formed on a substrate (not shown), the electron transporting layer 3 formed on the cathode 2, the photoactive layer 4 formed on the electron transporting layer 3, the hole transporting layer 5 formed on the photoactive layer 4 and the anode 1 formed on the hole transporting layer 5 are sequentially laminated.

The anode 1 or the cathode 2 is formed by using well-known chemical vapor deposition CVD or a method of printing paste metal ink where metal flake to particle are mixed with a binder, etc. However, the method of forming the anode 1 or the cathode 2 is not limited.

The substrate may be a glass substrate, a plastic substrate or a flexible substrate, etc. The plastic substrate includes at least one of plastics having PET (polyethylene terephthalate), PEN (polyethylenenaphthelate), PP (polypropylene), PI (polyamide), TAC (tri acetyl cellulose), PES (polyethersulfone) and so on. The flexible substrate includes an aluminum foil and a stainless steel foil.

The cathode 2 formed on the substrate is an electrode for providing electrons to a device, and may use ionized metal material, metal ink material having colloid state in certain liquid, transparent metal oxide, etc.

The cathode 2 may be formed through deposition by a vacuum deposition process under the condition of high vacuum state, or be formed by performing a solution process or a paste process about metal material used for forming conventional cathode. Material for forming the cathode 2 is not limited. The material used for forming the conventional cathode may be used as the material for forming the cathode 2. For example, the material used for forming the conventional cathode may be aluminum Al, calcium Ca, barium Ba, magnesium Mg, lithium Li, cesium Cs, etc. which are metal material oxidized easily.

The transparent metal oxide for forming the cathode 2 may be for example ITO (Indium Tin Oxide), FTO (Fluorine-doped Tin Oxide), ATO (Antimony Tin Oxide), AZO (Aluminum doped Zinc Oxide), etc. Here, the ITO is generally used as material for forming the anode. However, transparent cathode 2 may be formed by using the ITO in the organic solar cell having the inverted structure. In the event that the cathode 2 is a transparent metal oxide electrode, the cathode 2 may be formed by applying a process such as sol-gel, spray pyrolysis, sputtering, atomic layer deposition ALD, e-beam evaporation, etc. In sputtering, a sputter target used in the sputtering includes Cu, S, Ga and Sn.

The electron transporting layer 3 is a layer for realizing high efficiency of corresponding device by transporting electrons generated from the photoactive layer 4 to the cathode 2, and is formed between the cathode 2 and the photoactive layer 4.

The electron transporting layer 3 may be formed by blending cesium carbonate in zinc oxide.

Here, the blending means that two or more material is irreversibly mixed by solvent or melting, and is well-known term.

It is desirable that content of the blended cesium carbonate is in the range of 0.5 to 50 volume ratio.

The electron transporting layer 3 may be formed by using solution produced by injecting nano zinc oxide (ZnO) and cesium carbonate ($Cs_2CO_3$) in solvent such as ethanol, etc. and mixing the nano zinc oxide (ZnO) and the cesium carbonate ($Cs_2CO_3$) in the solvent. In this case, an additional process and time elapse is not required, compared with the electron transporting layer formed by laminating layer-by-layer the cesium carbonate on a zinc oxide layer. Accordingly, it is very economical in view of cost.

The photoactive layer 4 includes organic material, and generates electricity through photovoltaic of the organic material.

The organic material usable for the photoactive layer 4 may use organic polymer material and corresponding derivative used for the conventional photoactive layer. The organic polymer material includes electron donor material, such as P3HT (poly(3-hexylthiophene)), PCDTBT (Poly[N-9'-heptadecanyl-2,7-carbazole-alt-5,5-(4',7'-di-2-thienyl-2', 1',3'-benzothiadiazole)D, PSBTBT (Poly[2,6-(4,4'-bis(2-ethylhexyl)dithieno[3,2-b: 2',3'-d]silole)-alt-4,7 (2,1,3-benzothiadiazole)]) and PTB7(Poly{4,8-bis[(2-ethylhexyl)oxy]benzo[1,2-b: 4,5-b']dithiophene-2,6-diyl-alt-3-fluoro-2-[(2-ethylhexyl)carbonyl]thieno[3,4-b]thiophene-4,6-diyl}), and electron acceptor material such as PCBM-$C_{60}$ (Phenyl-C61-butyric acid methyl ester), ICBA (Indene-C60 bis-adduct) and so on.

Specially, it is desirable that P3HT uses as the electron donor and PCBM-$C_{60}$ uses as the electron acceptor, wherein the P3HT and the PCBM-$C_{60}$ are mixed with weight ratio of 1:0.5 to 1:4.

It is desirable that the photoactive layer 4 has a bulk-heterojunction structure to increase collection efficiency of a pair of divided electron-hole (exciton), but it is not limited.

The hole transporting layer 5 is a layer assisting to transfer holes generated from the photoactive layer 4 to the anode 1, and is formed between the photoactive layer 4 and the anode 1.

In one embodiment, the hole transporting layer 5 is formed by using the p-type oxide semiconductor containing the gallium Ga instead of general PEDOT:PSS.

Preferably, content of the gallium Ga in the p-type oxide semiconductor is in the range of 10 to 70 atomic percent.

In one embodiment, the p-type oxide semiconductor may be formed by the solution process. Here, the solvent may be a mixture produced by mixing acetonitrile of 5 to 50 volume percentage with ethylene glycol.

In another embodiment, at least one of DI water, alcohol, cyclohexane, toluene and organic solvent other than the acetonitrile may be used.

In one embodiment, the p-type oxide semiconductor may be formed by combining the gallium Ga with combination of one or more components selected from a group of CuS, SnO, ITO, IZTO, IGZO and IZO.

CuS means copper monosulfide, SnO indicates Tin(II) oxide, ITO means indium tin oxide, IZTO indicates indium zinc tin oxide, IGZO means indium zinc gallium oxide, and IZO indicates indium zinc tin oxide. It will be immediately obvious to those skilled in the art that these components are well-known.

The p-type oxide semiconductor of the invention may be expressed with at least one of chemical formula 1, chemical formula 2 and chemical formula 3, like the oxide semiconductor.

$$CuS_{(1-x)}Ga_x\text{—}SnO \qquad \text{[Chemical formula 1]}$$

$$CuSGa_xSn_{(1-x)}O \qquad \text{[Chemical formula 2]}$$

$$CuSGa_xSnO \qquad \text{[Chemical formula 3]}$$

In the chemical formula 1, the chemical formula 2 or the chemical formula 3, $0<x<1$.

In one embodiment, the invention provides a method of manufacturing the p-type oxide semiconductor comprising sequentially:

producing precursor solution including Cu, S, M and Ga (here, M indicates a compound including one or more components selected from a group of SnO, ITO, IZTO, IGZO and IZO);

coating the precursor solution on the substrate; and heat-treating a layer corresponding to the coating.

It is desirable that the precursor solution contains [$CuTu_3$]Cl.

It is desirable that the precursor solution includes Thiourea.

The coating may be performed by a vacuum process, a spin coating, a slot printing or an inkjet printing process.

However, it is desirable that the coating is performed by the spin coating or the inkjet printing process in view of simplicity of the process and cost.

The anode 1 is an electrode providing holes to the device, and is formed by a metal paste process or a solution process such as a process of screen-printing metal ink material which exists in colloid state in certain liquid, etc. Here, the metal paste may be any one selected from a group of silver (Ag) paste, aluminum (Al) paste, gold (Au) paste, copper (Cu) paste, etc., or their alloy. The metal ink material may be at least one of silver (Ag) ink, aluminum (Al) ink, gold (Au) ink, calcium (Ca) ink, magnesium (Mg) ink, lithium (Li) ink, cesium (Cs) ink. Metal material included in the metal ink material is ionized in the solution.

In the above description, the organic solar cell of the invention is described in detail. In another embodiment, in the event of forming the hole transporting layer using the p-type oxide semiconductor, the hole transporting layer may be applied to other organic electrical device and other solar cell as well as the organic solar cell including the photoactive layer.

A method of manufacturing the organic solar cell according to one embodiment of the invention comprising:

forming an anode on a substrate by using a vacuum deposition process;

forming a hole transporting layer on the anode by using a solution process;

forming a photoactive layer on the hole transporting layer by using a solution process;

forming an electron transporting layer on the photoactive layer by using a solution process; and forming a cathode on the electron transporting layer.

The hole transporting layer is formed by coating using solution where the p-type oxide semiconductor containing the gallium is mixed with solvent.

Hereinafter, embodiments of the invention will be described in more detail. However, following embodiments are used for describing the invention, but they do not limit scope of the invention.

Embodiment

A hole transporting layer is formed by using a p-type oxide semiconductor containing gallium instead of PEDOT: PSS.

Here, content of the gallium in the p-type oxide semiconductor is preferably in the range of 10 to 70 atomic percent.

Solvent is produced by intensely mixing ethylene glycol with acetonitrile in atmosphere. A mixing solution is manufactured by mixing the p-type oxide semiconductor containing the gallium in the solvent by concentration of 0.2M/16.

The mixing solution is printed on the anode in nitrogen environment.

FIG. 11 is a view illustrating an energy band diagram when the p-type oxide semiconductor containing gallium is used and an energy band diagram when PDDOT:PSS is used.

(a) in FIG. 11 shows an energy band diagram of the PEDOT:PSS, and (b) in FIG. 12 illustrates an energy band diagram of the p-type oxide semiconductor containing gallium.

A HOMO level of the PEDOT:PSS equals to −5.2 eV as shown in (a) in FIG. 11, and a HOMO level of the p-type oxide semiconductor containing the gallium equals to −5.12 eV as shown in (b) in FIG. 11. As a result, it is verified that the p-type oxide semiconductor is more effective when holes transport from the photoactive layer to the anode.

FIG. 12 and Table 2 illustrate a current-voltage characteristic of a solar cell when the p-type oxide semiconductor is used and a current-voltage characteristic of the solar cell when the PEDOT:PSS is used.

Here, a characteristic value of the solar cell is expressed in Jsc, Voc and PCE (Efficiency).

(a) in FIG. 12 shows characteristics of the solar cell in a dark state, and (b) in FIG. 12 illustrates characteristics of the solar cell in a light state.

Jsc means a short-circuit current density, Voc indicates an open-circuit voltage, FF means a fill factor, and PCE indicates energy conversion efficiency. The fill factor (FF) equals to a voltage value (Vmax)×current density(Jmax)/(Voc×Jsc) at a maximum power point. The energy conversion efficiency equals to FF×(Jsc×Voc)/Pin, wherein Pin=100 [mW/cm$^2$].

TABLE 2

|  | Jsc(mA/cm$^2$) | Voc(V) | FF(%) | PCE(%) |
| --- | --- | --- | --- | --- |
| PEDOT:PSS | 14.5 | 0.748 | 66.9 | 7.27 |
| CuS—GaSnO | 15.0 | 0.763 | 69.5 | 7.97 |

Referring to FIG. 12 and table 2, the energy conversion efficiency is 7.27% when only PEDOT:PSS is used as the hole transporting layer.

It is verified that the energy conversion efficiency increases up to 7.98% when the p-type oxide semiconductor containing the gallium is used as the hole transporting layer.

FIG. 13 and Table 3 show an external quantum efficiency EQE of the solar cell when the p-type oxide semiconductor containing the gallium is used and an EQE of the solar cell when the PEDOT:PSS is used.

TABLE 3

|  | EQE(%) | EQE(%) |
| --- | --- | --- |
| PEDOT:PSS | 68.1 at 460 nm | 63.0 at 620 nm |
| CuS—GaSnO | 70.2 at 440 nm | 67.0 at 620 nm |

Referring to FIG. 13 and Table 3, it is verified that EQE when the hole transporting layer is formed by printing the p-type oxide semiconductor containing the gallium is higher than that when the hole transporting layer is formed by using the PEDOT:PSS.

FIG. 14 and Table 4 illustrate current-voltage characteristics of the solar cell when the hole transporting layer is formed by using p-type oxide semiconductors containing different concentration of gallium according to one embodiment of the invention.

FIG. 15 shows EQE of the solar cell according to concentration of the gallium.

TABLE 4

| Cu$_{45}$S$_{100}$—Ga$_x$Sn$_x$O Ga % | Jsc(mA/cm$^2$) | Voc(V) | FF(%) | PCE(%) |
| --- | --- | --- | --- | --- |
| 10% | 15.0 | 0.753 | 66.6 | 7.50 |
| 30% | 15.0 | 0.756 | 67.9 | 7.71 |
| 50% | 15.0 | 0.762 | 69.0 | 7.88 |
| 70% | 15.3 | 0.745 | 66.0 | 7.51 |
| 90% | 15.1 | 0.732 | 64.9 | 7.19 |
| 100% | 14.8 | 0.757 | 63.5 | 6.91 |

Referring to Table 4, FIG. 14 to FIG. 15, it is verified that the energy conversion efficiency is high when content of the gallium in the p-type oxide semiconductor is in the range of 10 to 70 percent.

The embodiments of the invention described above are disclosed only for illustrative purposes. A person having ordinary skill in the art would be able to make various modifications, alterations, and additions without departing from the spirit and scope of the invention, but it is to be appreciated that such modifications, alterations, and additions are encompassed by the scope of claims set forth below.

The invention claimed is:

1. A p-type oxide semiconductor where gallium (Ga) is further combined with a combination of CuS and SnO,
   wherein the p-type oxide semiconductor is a single layer expressed with following chemical formula 1

$$CuSGa_xSn_{(1-x)}O \qquad \text{[Chemical formula 1]}$$

where, $0.45 < \chi < 1$.

2. The p-type oxide semiconductor of claim 1, wherein the p-type oxide semiconductor has an amorphous structure.